United States Patent [19]
Lee et al.

[11] Patent Number: 5,675,293
[45] Date of Patent: Oct. 7, 1997

[54] VOLTAGE CONTROLLED RING OSCILLATOR

[75] Inventors: Bhum Cheol Lee; Jae Young Kim; Eun Chang Choi; Kwon Chul Park, all of Daejeon, Rep. of Korea

[73] Assignees: Electronics and Telecommunications Research Institute, Daejeon; Korea Telecommunication Authority, Seoul, both of Rep. of Korea

[21] Appl. No.: 582,882

[22] Filed: Jan. 4, 1996

[30] Foreign Application Priority Data

Nov. 2, 1995 [KR] Rep. of Korea ............... 1995-39428

[51] Int. Cl.$^6$ ........................................ H03B 5/02
[52] U.S. Cl. ................ 331/57; 331/135; 331/177 R; 331/DIG. 3
[58] Field of Search .................... 331/57, 135, 177 R, 331/DIG. 3

[56] References Cited

U.S. PATENT DOCUMENTS

| | | | |
|---|---|---|---|
| 4,565,976 | 1/1986 | Campbell | 331/57 |
| 4,884,041 | 11/1989 | Walker | 331/57 |
| 5,416,444 | 5/1995 | Yamauchi et al. | 331/57 |

OTHER PUBLICATIONS

K.E. Syed et al, "Gigahertz Voltage–controlled Ring Oscillator", Electronic Letters, Jun. 5, 1986, vol. 22, No. 12, pp. 677–679.

*Primary Examiner*—Siegfried H. Grimm
*Attorney, Agent, or Firm*—Spencer & Frank

[57] ABSTRACT

A voltage controlled ring oscillator having a reduced voltage controlled oscillator (VCO) gain by controlling only the fall time of the period of the VCO using integrated circuits and logic circuits. The VCO includes a mixer/inverter circuit, a logic circuit, a delay/inverter circuit, a first delay circuit, a second delay circuit, and a third delay circuit. The VCO gain is reduced by controlling only one pulse width of the logic level High and one pulse width of the logic level Low of the oscillating period. Furthermore, the VCO can be logically controlled by using a simple logic circuit as a component of the VCO.

17 Claims, 5 Drawing Sheets

1

VOLTAGE CONTROLLED RING OSCILLATOR

BACKGROUND OF THE INVENTION

1. Field of the Invention

The present invention relates in general to voltage controlled oscillators (VCO), and more particularly, to a voltage controlled ring oscillator that has a smaller gain for the VCO than that of previous VCO's. The present invention operates more stably against exterior noises by controlling only one pulse width of the logic level High and one pulse width of the logic level Low of the oscillating period in the ring VCO. The ring VCO of the present invention is comprised of integrated circuits.

2. Description of the Prior Art

In conventional ring oscillators, there is a limit to increasing the oscillator frequency, because the fall time of the ring oscillator is determined according to the total delay time of the ring oscillator's inverter delay elements. The conventional ring oscillator's oscillator frequency is controlled through its period. Although the delay time should be controlled for every fall time, this leads to double delay time control of the inverter each period, resulting in too much VCO gain. See U.S. Pat. No. 4,565,976 by D. L. Campbell.

If the VCO gain is too large, the control voltage would need to be very small and would be very difficult to obtain. Specifically, if the VCO gain is 1 GHz/Volt, the control voltage needs to be on the order of 1 µV to control the frequency on the order of 1 KHz. With this setting, an operating environment having very little noise is required.

In another conventional ring oscillator, the VCO controls the oscillator frequency by the relative delay between two paths by using an analog mixer. This VCO can increase the oscillator frequency, but the delay time control of the fall time is effected each period. Thus, too much VCO gain is obtained, and the VCO operates unstably when external noise exists. See K. E. Syed and A. A. Abidi, "Gigahertz Voltage-controlled Ring Oscillator", Electronic Letters, Jun. 5, 1986, vol. 22, No. 12, and U.S. Pat. No. 4,884,041 by R. C. Walker.

FIG. 1 is a block diagram of a conventional voltage controlled ring oscillator. In FIG. 1, the circuit contains an inverter/combination circuit 11 and three delay elements 12, 13 and 14 which introduce delays of d1, d2 and d3, respectively. See U.S. Pat. No. Number 4,884,041 by R. C. Walker.

In a conventional voltage controlled ring oscillator as in FIG. 1, the delay element 13 produces a signal Vy at the first input of the inverter/combination circuit 11 and the delay element 14 produces a signal Vx at a second input of the inverter/combination circuit 11. The output signal Vz of the inverter/combination circuit 11 is equal to the linear combination—[CVx+(1−C)Vy], where "−" means the inversion of the signal waveform. C is in the range $0 \leq C \leq 1$, and C is determined by a control voltage Vc applied to the inverter/combination circuit 11.

The relative delay d3−d2 produces a relative phase shift $P=2\Pi f(d3-d2)=w(d3-d2)$ of signal Vx relative to signal Vy, where f is the frequency of the oscillator and w is the angular frequency of the oscillator. As C varies from 0 to 1, the phase shift between Vz and Vy varies from 1 to P.

Therefore, the circuit within the dashed line 15 is an inverting variable delay element which introduces a delay that varies from delay time d2 for C=0 to delay time d3 for C=1. The frequency of the oscillator is ½(d1+(d2+d3)/2), and the variable frequency, hereinafter referred to as 'fv', is $1/(2(d1+d2))-1/(1(d1+d3))$.

When a VCO is constructed as above, stable oscillation occurs only when there are at least 3 inverters. Further, maximum oscillator frequency is obtained when d1+d2 equals the total delay of the three inverters, and minimum oscillator frequency is obtained when d1+d2 equals the total delay of five inverters. In other words, the maximum oscillator frequency, hereinafter referred to as 'fmax', equals 1/(2×3D), and minimum oscillator frequency, hereinafter referred to as 'fmin', equals 1/(2×5D), where D corresponds to the delay of one inverter. The central frequency, hereinafter referred to as 'fc', becomes 8/10 fmax, and Δf=4/10 fmax=½ fc. Therefore, the VCO gain is too large.

To overcome the above-mentioned problem, it is an object of the present invention to provide a voltage controlled ring oscillator for controlling only the fall time of the VCO with integrated circuit technology. By using the logic circuit, the too large VCO gain can be reduced.

To accomplish the above object, the present invention uses a voltage controlled ring oscillator comprising a mixer/inverter means having an output terminal outputting the mixed result of the voltage from a first input terminal with the voltage from a second input terminal according to the voltage from a control voltage input terminal; a logic circuit means having an input coupled to the output of the mixer/inverter means, and an output having a Low(High) level transition when either of its two inputs has a High(Low) level transition firstly, and having a High(Low) level transition when either of its two inputs has a Low(High) level transition secondly; a delay/inverter means having an input connected to the output of the logic circuit means, and an output supplying a delayed and inverted version of the output of the logic circuit means; a first delay means having an input connected to the output of the logic circuit means, and an output supplying a delayed output of the logic circuit means to the other input terminal of the logic circuit means; a second delay means having an output supplying the output of the delay/inverter means with or without a delay to the input terminal of the mixer/inverter means; and a third delay means having an output supplying the delayed output of the delay/inverter means to the other input terminal of the mixer/inverter means.

BRIEF DESCRIPTION OF THE DRAWINGS

Additional objects and advantages of the present invention will be apparent from the detailed description of the preferred embodiment thereof, which proceeds with reference to the accompanying drawings in which.

DETAILED DESCRIPTION OF THE INVENTION

Figure 1:
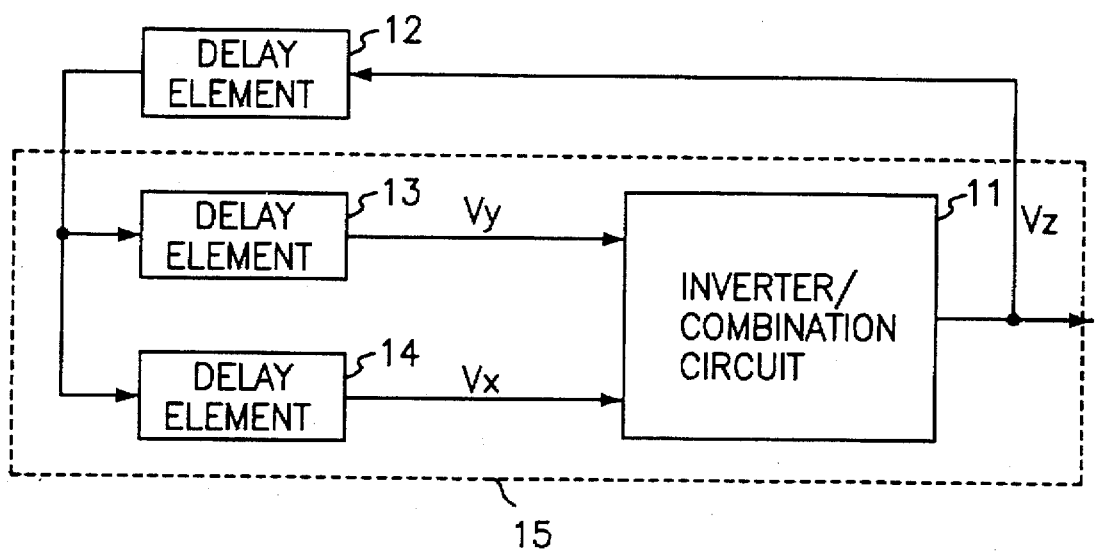
FIG. 1 is a block diagram showing a conventional voltage controlled ring oscillator.
Figure 2:
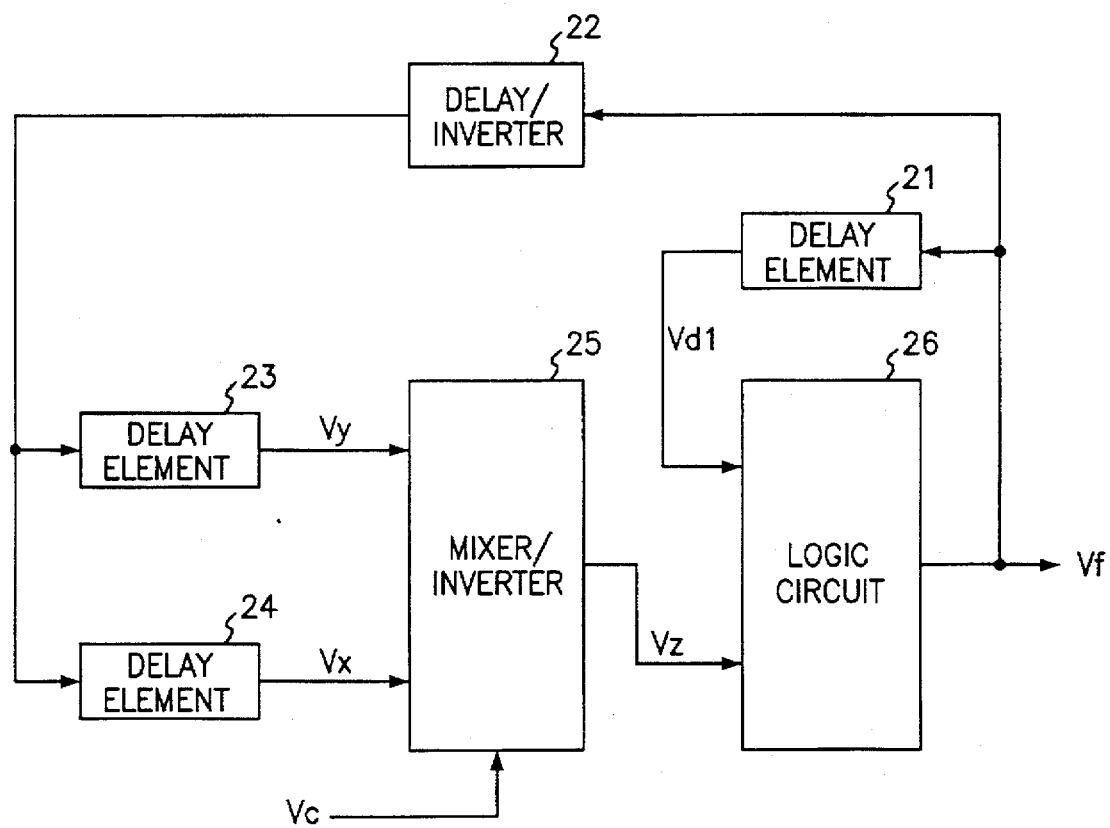
FIG. 2 is a block diagram showing a voltage controlled ring oscillator according to the present invention.

FIG. 2 is a block diagram of a voltage controlled ring oscillator according to the present invention.

Referring to FIG. 2, the voltage controlled ring oscillator according to the present invention comprises a mixer/inverter 25 having an output terminal which is supplied with the mixed result of the voltage Vy from a first input terminal with the voltage Vx from a second input terminal; a logic circuit 26 having a second input receiving the output of the mixer/inverter 25, and an output having a Low level transition when either of its two inputs has a High level transition firstly, and having a High level transition when either of its two inputs has a Low level transition secondly, or vice versa having a High level transition when either of its two inputs has a Low level transition firstly, and having a Low level transition when either of its two inputs has a High level transition secondly; a delay/inverter d4 and 22 having an input connected to the output of the logic circuit 26, and an output supplying a delayed and inverted output of the logic circuit 26; a first delay element d1 and 21 having an input connected to the output of the logic circuit 26, and an output supplying a delayed output of the logic circuit 26 to a first input terminal of the logic circuit 26; a second delay element d2 and 23 having an input connected to the output of the delay/inverter 22, and an output supplying the output of the delay/inverter 22 with or without a delay to the first input terminal of the mixer/inverter 25; and a third delay element d3 and 24 having an input connected to the output of the delay/inverter 22, and an output supplying a delayed output of the delay/inverter 22 to the second input terminal of the mixer/inverter 25.

The above construction is such that the output of the logic circuit 26 is the driving waveform $T=d1+d4+Cd3+(1-C)d2$, where C varies from 0 to 1 according to Vc.

Figure 3:
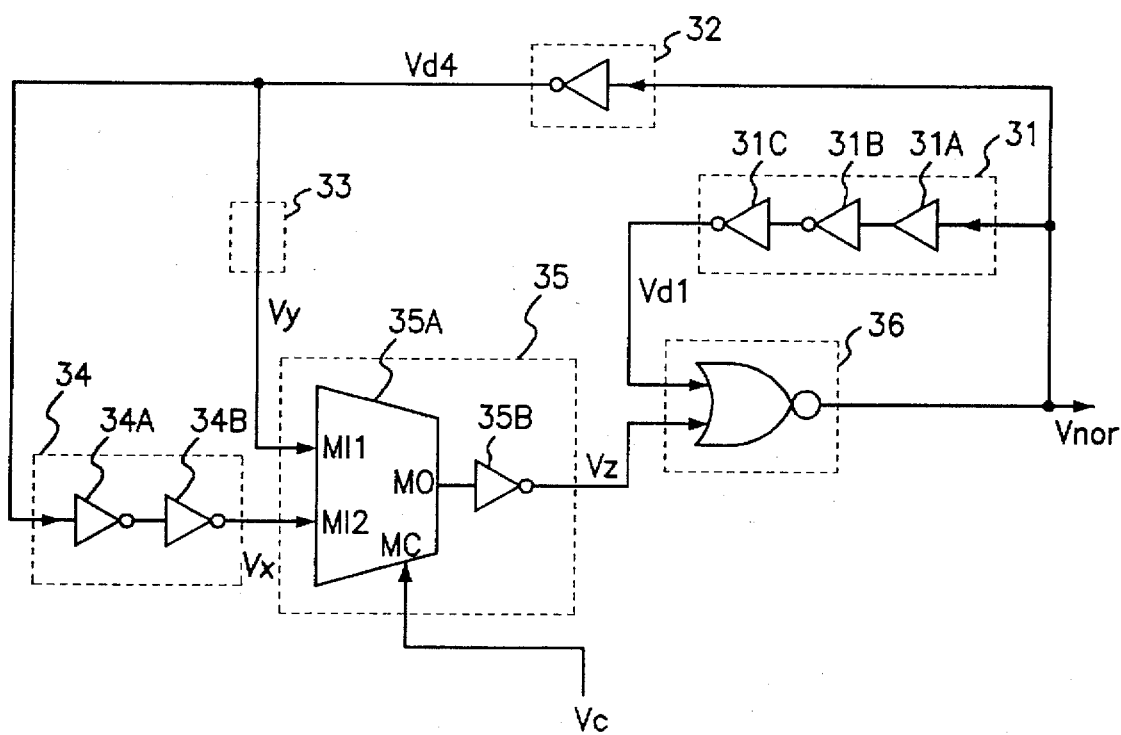
FIG. 3 is a detailed circuitry diagram showing the voltage controlled ring oscillator.

FIG. 3 is a detailed circuit diagram according to an embodiment of the present invention. This circuit contains a mixer/inverter 35 and first, second and third delay elements 31, 33 and 34. This circuit corresponds to the case where the input signal of the second delay element is passed through the second delay element without being delayed. The circuit also contains a delay/inverter element 32 and a NOR gate 36, which is a logic circuit having two inputs.

The operation and function of each element of the present invention are as follows:

The mixer/inverter 35 includes a mixer 35A and an inverter 35B. The mixer 35A has a first input terminal MI1 and a second input terminal MI2, a control voltage input terminal MC, and an output terminal MO. MI1 is connected to the output of the second delay element 33, MI2 is connected to the output of the third delay element 34, and MO is connected to the input of the inverter 35B and then to the second input terminal of the NOR gate having two inputs. Thus, the voltage Vy of MI1 and the voltage Vx of MI2 are mixed and inverted according to the voltage VC applied to the control voltage input terminal MC. If a delay is made by D only in inverter 35B, but not in mixer 35A of said mixer/inverter 35, the voltage Vm at MO equals $(1-C)Vy+CVx$, where C is a variable varying from 0 to 1 according to VC. Vm has a value between the logic level High and the logic level Low ($0\leq Vm\leq 1$), and thus Vz equals $1-Vm(t-D)$, where $Vm(t-D)$ represents the delay of the signal VM(t) by D.

The logic circuit or combination logic circuit 36 may be constructed by a NAND gate or the combination logic circuit. In this embodiment, the logic circuit or combination logic circuit 36 is constructed by the NOR gate having two inputs. To the first and second inputs of the NOR gate, the output of first delay element 31 and the output Vz of the mixer/inverter 35 are provided respectively. The output of the NOR gate is connected to the input of the first delay element 31 and the input of the delay/inverter 32.

Through delay/inverter 32, the output of the logic circuit 36, which is a NOR gate having two inputs, is delayed by a predetermined time and inverted, and then is supplied to the input of the third delay element 34.

Figure 4:
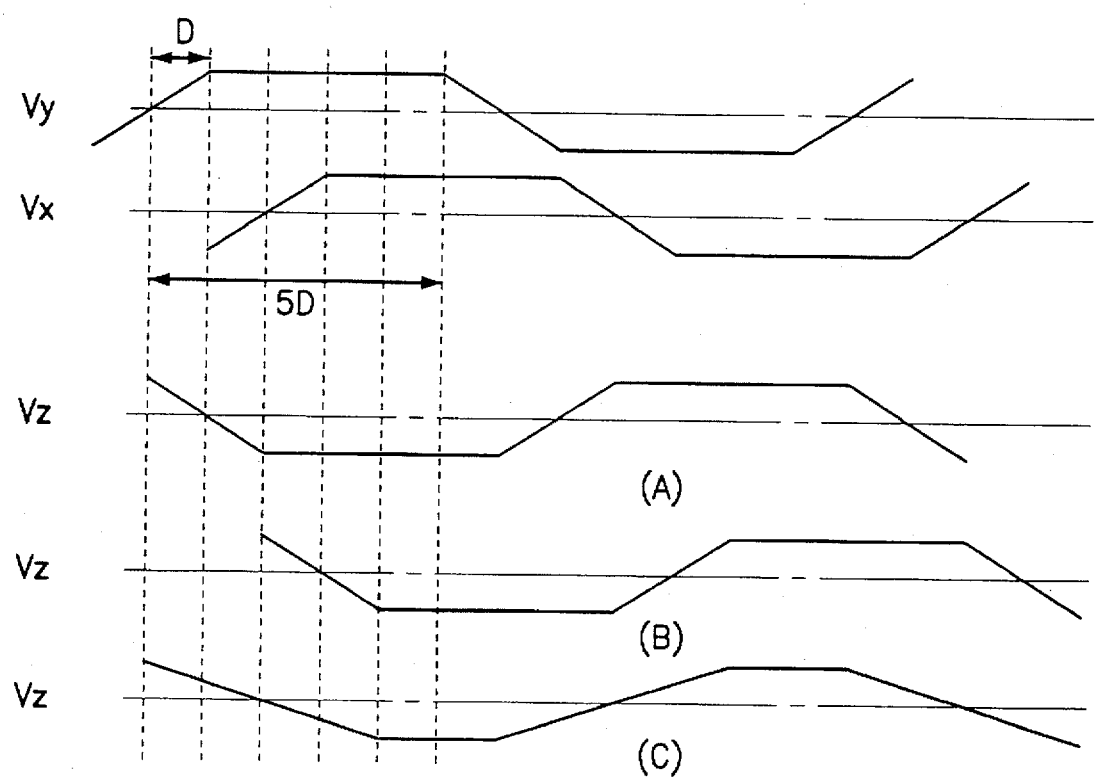
FIG. 4 is a timing chart for each part of the mixer/inverter shown in FIG. 3.

FIG. 4 shows waveforms which are input to the mixer/inverter 35, from which the operation according to the embodiment of the present invention will be more simplified and apparent.

Referring to FIG. 4, the ordinate represents the logic level and the abscissa represents the time. The dotted lines of the abscissa represents the point at which the value determined by the logic level is 0.5. In FIG. 4, if $0\leq t\leq 5D$, the waveforms of each part will be as follows:

$$Vx=((t/2D)-1)U(t-2D)-((t/2D)-2)U(t-4D)+U(t-4D), \text{ and}$$

$Vy=(t/2D)U(t)-((t-2D)-1)U(t-2D)+U(t-2D)$, where $U(t)$ is a unit step function, and $U(t)=1$ at $t=0$. Thus, $Vm=C\{((t/2D)-1)U(t-2D)-((t/2D)-2)U(t-4D)+U(t-4D)\}+(1-C)\{(t/2D)U(t)-((t-2D)-1)U(t-2D)+U(t-2D)\}$, and $$Vz=1-Vm(t-D).$$

In FIG. 4, (A) represents the waveform of Vz for Vx and Vy when C=0; (B) represents the waveform of Vz for Vx and Vy when C=1; and (C) represents the waveform of Vz for Vx and Vy when C=0.5.

The mixer/inverter 35 includes a mixer 35A and an inverter 35B. Now, the following description is based on the assumption that no delay is made in the mixer 35A (however, in reality, this assumption is not required because the mixer 35A and the inverter 35B are configured as one element), and logic level of High or Low is determined at the center of the transition. Further, it is assumed that: the first delay element 31 includes a first and a second inverter 31B and 31C and a buffer 31A, each of which has a delay time of D, so that the delay time of the first delay element 31 is 3D; the delay time of the delay/inverter element 32 is D; the delay time of the second delay element is 0; the delay time of the third delay element is 2D; and the delay time of the NOR gate 36 having two inputs is D.

Accordingly, the delay relationship of the mixer/inverter 35 is $Vz(D)=3CD+(1-C)D$, where 3CD is the delay time for CVx, $(1-C)D$ is the delay time for $(1-C)Vy$, and C varies from 0 to 1 according to Vc.

The operation according to the embodiment of the present invention is as follows:

If the output Vnor of the NOR gate 36 is logic level Low at the first stage (where logic level High at the first stage will have the same results because of cycling), the first input Vd1 of the NOR gate 36 is at logic level Low after the lapse of 3D, and the second input Vz of the NOR gate 36 is at logic level Low after the lapse of 2D or 4D. In this condition, the delay of the waveform, which is supplied to the second input Vz of NOR gate 36, is controlled by the delay relationship, $Vz(D)=3CD+2(1-C)D$.

If C=0, the mixer 35A of the mixer/inverter 35 selects MI1. Logic level Low is supplied to the first and second input terminals of the NOR gate 36 after the lapse of 3D and 2D, respectively, from when the output of the NOR gate 36 was converted into logic level Low. At the same time, the output Vnor of the NOR gate 36 is synchronized with the waveform Vd1 of the first input terminal from when either input of the two inputs of the NOR gate has the Low level transition second. This results in the transition to logic level High at the output of the NOR gate after the lapse of 1D from when the logic level Low was supplied to the first input terminal. Thus, if C=0 and Vz(D)=D, the pulse width of the logic level Low of the output Vnor of the NOR gate 36 becomes 4D.

If C=1, the mixer 35A of the mixer/inverter 35 selects MI2. Logic level Low is supplied to the first and second input terminals of the NOR gate 36 after the lapse of 3D and 4D, respectively, from when the output of the NOR gate 36 was converted into logic level Low. At the same time, the output Vnor of the NOR gate 36 is synchronized with the waveform Vz of the second input terminal from when either input of the two inputs of the NOR gate has the Low level transition second. This results in the transition to logic level High at the output of the NOR gate after the lapse of 1D from when the logic level Low was supplied to the second input terminal. Thus, if C=1 and Vz(D)=3D, the pulse width of the logic level Low of the output Vnor of the NOR gate 36 becomes 5D.

Further, according to this embodiment, at the output Vnor of the NOR gate 36, the transition to logic level High will be described. Further, to the first input Vd1 of the NOR gate 36, logic level High is supplied after 3D, and to the second input Vz of the NOR gate 36, logic level High is supplied after 2D or 4D.

If C=0, the mixer 35A of the mixer/inverter 35 selects MI1 Logic level High is supplied to the first and second input terminals of the NOR gate 36 after the lapse of 3D and 2D, respectively, from when the output of the NOR gate 36 was converted into logic level High. At the same time, the output Vnor of the NOR gate 36 is synchronized with the waveform Vz of the second input terminal from when either input of the two inputs of the NOR gate has the High level transition first. This results in the transition to logic level Low at the output of the NOR gate after the lapse of 1D from when the logic level Low was supplied to the second input terminal. Thus, if C=0 and Vz(D)=2D, the pulse width of the logic level High of the output Vnor of the NOR gate 36 becomes 3D.

If C=1, the mixer 35A of the mixer/inverter 35 selects MI2, where Vz(D)=4D. Logic level High is supplied to the first and second input terminals of the NOR gate 36 after the lapse of 3D and 4D, respectively, from when the output of the NOR gate 36 was converted into logic level High. At the same time, the output Vnor of the NOR gate 36 is synchronized with the waveform Vd1 of the first input terminal from when either input of the two inputs of the NOR gate has the High level transition first. This results in the transition to logic level Low at the output of the NOR gate after the lapse of 1D from when the logic level High was supplied to the first input terminal. Thus, if C=1, the pulse width of the logic level Low of the output Vnor of the NOR gate 36 becomes 4D.

Thus, according to one embodiment of the present invention, if C=1, the period of the VCO oscillator becomes maximum, leading to a minimum for the oscillator frequency, and the period of the VCO oscillator is 1/fmin= Tmax=5D(Low pulse width)+4D(High pulse width). If C=0, the period of the VCO oscillator becomes minimum and is 1/fmax=Tmin=4D(Low pulse width)+3D(High pulse width). Hence, the variable frequency becomes fv=$\frac{1}{7}$D– $\frac{1}{9}$D=$\frac{2}{63}$D, which is a reduction of about one half compared to conventional case results.

If the oscillator frequency of VCO has a central value (that is, C=0.5), the mixer 35A of the mixer/inverter 35 selects MI1 and MI2 with 0.5 weighting values, where Vz(D)=1D. Logic level Low/High is supplied to the first and second input terminals of the NOR gate 36, respectively, simultaneously, after the lapse of 3D from when the output of the NOR gate 36 was converted into logic level Low/ High. At the same time, the output Vnor of the NOR gate 36 is synchronized with the waveform of the first or second input terminal. This results in the transition to logic level High/Low at the output after the lapse of 1D from when the logic level Low/High was supplied to the first and second input terminals. Thus, if C=0.5, the pulse width of the logic level Low/High of the output Vnor of the NOR gate 36 becomes 4D, and the central frequency of VCO is fc=$\frac{1}{8}$D.

Consequently, the VCO output Vnor frequency of the present invention is controlled by C which is varied in accordance with the control voltage Vc. In the embodiment of FIG. 3, the period of the VC output Vnor becomes T=4D+2D+3CD+(1–C)D.

Figure 5A:
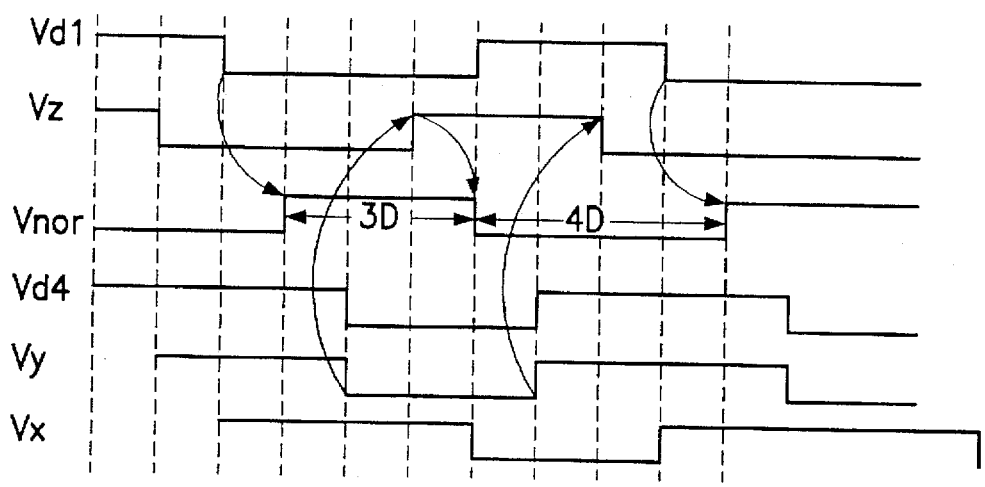
FIGS. 5(A)-5(C) are timing diagrams for each part of the circuit of the present invention shown in FIG. 3.
Figure 5B:
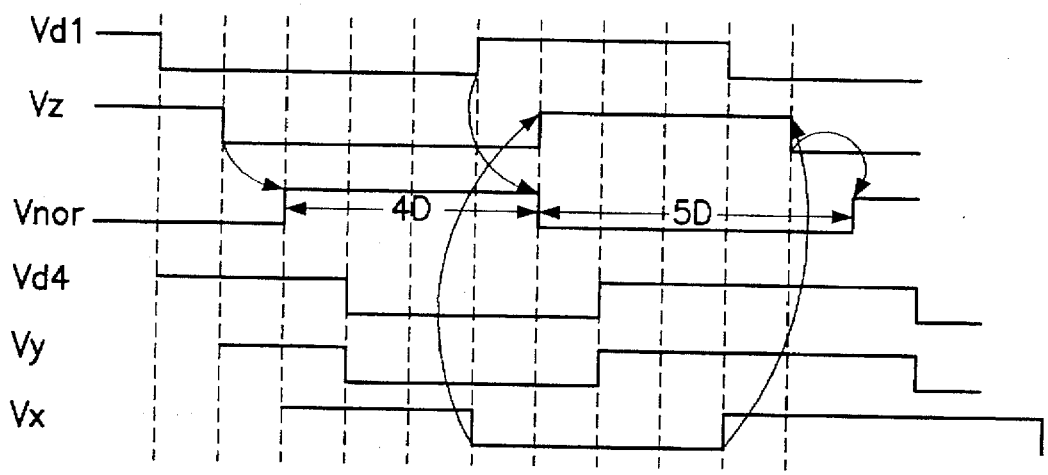
Figure 5C:
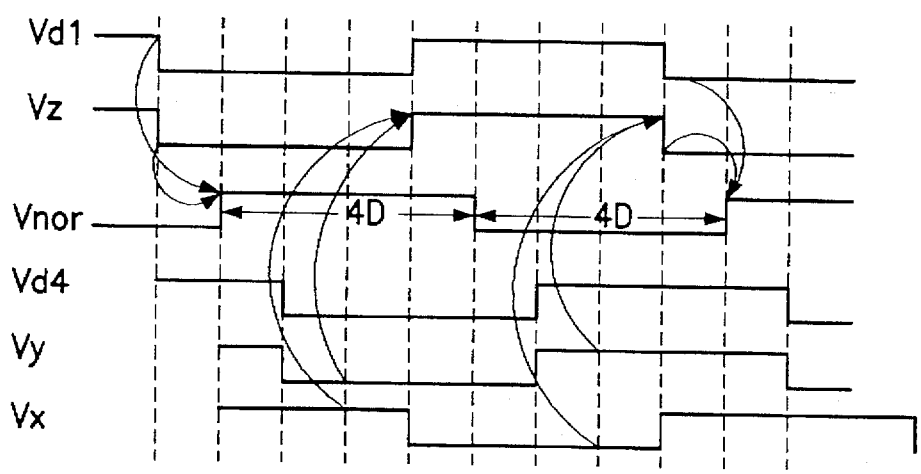

FIG. 5 illustrates the timing diagrams for each part of the circuit according to the embodiment of the present invention shown in FIG. 3. In FIG. 5, it was assumed that High-Low or Low-High transition propagation delay is contained in each element. Referring to FIG. 5, the ordinate represents the logic level of each part and the abscissa represents the time.

FIG. 5 illustrates the timing diagrams for each part shown in FIG. 3, where (A) is the case of C=0, (B) is the case of C=1.0, and (C) is the case of C=0.5.

Referring to FIG. 5 (A) for the case of C=0, the waveform of Vnor, which is the VCO output of the present invention, is converted into logic level High after D from when Vd1 is converted into logic level Low. If C=0 in FIG. 3, Vz, which is the output of the mixer/inverter 35, is converted into logic level High after D from when Vy is converted into logic level Low, because Vy is selected at the input of the mixer/inverter 35 in FIG. 3. After D from when Vz is converted into logic level High, Vnor is converted into logic level Low. If Vnor is converted into Low, the operation is returned to the initial stage, and after D from when Vd1 is converted into logic level Low, the waveform of Vnor is converted into logic level High, and thus one cycle of the VCO oscillator frequency is formed.

Thus, in the case of C=0 as shown in FIG. 5 (A), the VCO oscillator frequency becomes T(C=0)=$\frac{1}{7}$D.

Referring to FIG. 5 (B) for the case of C=1, the waveform of Vnor, which is the VCO output of the present invention, is converted into logic level High after D from when Vz is converted into logic level Low. If C=1 in FIG. 3, Vz, which is the output of the mixer/inverter 35, is converted into logic level High after D from when Vx is converted into logic level Low, because Vx is selected at the input of mixer/ inverter 35 in FIG. 3. After D from when Vd1 is converted into logic level High, Vnor is converted into logic level Low. If Vnor is converted into Low, the operation is returned to the initial stage, and after D from when Vz is converted into logic level Low, the waveform of Vnor is converted into logic level High, and thus one cycle of the VCO oscillator frequency is formed. Thus, in the case of C=1 as shown in FIG. 5 (B), the VCO oscillator frequency becomes T(C=1) =$\frac{1}{9}$D.

Referring to FIG. 5 (C) for the case of C=0.5, the waveform of Vnor, which is the VCO output of the present invention, is converted into logic level High after D from when Vd1 is converted into logic level Low. If C=0.5 in FIG. 3, Vz, which is the output of mixer/inverter 35, is converted into logic level High after D from when Vx and Vy are selected as weighted values at the input of the mixer/inverter 35 in FIG. 3. After D from when Vz and Vd1 are converted into logic level High, Vnor is converted into logic level Low. After D from when Vd1 is converted into logic level Low, the waveform of Vnor is converted into logic level High, and thus one cycle of the VCO oscillator frequency is formed. Thus, in the case of C=0.5 as shown in FIG. 5 (C), the VCO oscillator frequency becomes T(C=0.5)=$\frac{1}{8}$D.

According to the above principles, the oscillator frequency in the VCO of the present invention is changed according to C varying from 0 to 1.

Therefore, the VCO according to the present invention can be used as a substitute for the conventional voltage controlled ring oscillator. Further, the present invention provides the following features:

Firstly, the VCO gain can be reduced by about one half the gain in the conventional cases, by controlling only one pulse width of the logic level High and one pulse width of the logic level Low of the oscillating period.

Secondly, the VCO can be logically controlled by using a simple logic circuit as a component of the VCO.

What is claim is:

1. A voltage controlled ring oscillator comprising:
   a mixer/inverter means having an output terminal at which the mixed result of the voltage of a first input terminal with the voltage of a second input terminal according to the voltage Vc of a control voltage input terminal is supplied;
   a logic circuit means having an input to which is supplied the output of said mixer/inverter means, and an output having a Low(High) level transition when either input of two inputs has a High(Low) level transition firstly, and having a High(Low) level transition when either input of two inputs has a Low(High) level transition secondly;
   a delay/inverter means having an input connected to the output of said logic circuit means, and an output which is supplied with a delayed and inverted output of said logic circuit means;
   a first delay means having an input connected to the output of said logic circuit means, and an output which is supplied with said delayed output of said logic circuit means to another input terminal of said logic circuit means;
   a second delay means having an input connected to the output of said delay/inverter means, and an output which is supplied with the output of said delay/inverter means with or without a delay and which is connected to said first input terminal of said mixer/inverter means; and
   a third delay means having an input connected to the output of said delay/inverter means, and an output which is supplied with the delayed output of said delay/inverter means and which is connected to said second input terminal of said mixer/inverter means.

2. A voltage controlled ring oscillator as claimed in claim 1, wherein said logic circuit means is a NOR gate having two inputs.

3. A voltage controlled ring oscillator as claimed in claim 1, wherein the waveform at said output of said logic circuit means has a period determined by the delay time of said first delay means+the delay time of said delay/inverter means+(a variable C dependant on control voltage Vc×the delay time of said third delay means)+{(1−the variable C dependant on control voltage Vc)×the delay time of said second delay means}.

4. A voltage controlled ring oscillator comprising:
   a mixer/inverter circuit having a first input, a second input, a control voltage input, and an output, wherein the output is a mixture of the first input and the second input according to the control voltage input;
   a logic circuit having a first input, a second input coupled to the output of the mixer/inverter circuit, and an output, wherein the output of the logic circuit has a level transition related to when the first input of the logic circuit or the second input of the logic circuit has another level transition;
   a delay/inverter circuit having an input coupled to the output of the logic circuit and an output;
   a first delay circuit having an input coupled to the output of the logic circuit and an output coupled to the first input of the logic circuit;
   a second delay circuit having an input coupled to the output of the delay/inverter circuit and an output coupled to the first input of the mixer/inverter circuit; and
   a third delay circuit having an input coupled to the output of the delay/inverter circuit and an output coupled to the second input of the mixer/inverter circuit.

5. A voltage controlled ring oscillator as in claim 4, wherein the output of the logic circuit has a Low (High) level transition after either the first input of the logic circuit or the second input of the logic circuit has a High (Low) level transition firstly, and wherein the output of the logic circuit has a High (Low) level transition after either the first input of the logic circuit or the second input of the logic circuit has a Low (High) level transition secondly.

6. A voltage controlled ring oscillator as in claim 4, wherein the output of the delay/inverter circuit is a delayed and inverted version of the input of the delay/inverter circuit.

7. A voltage controlled ring oscillator as in claim 4, wherein the input of the second delay circuit is either delayed or not delayed to the output of the second delay circuit.

8. A voltage controlled ring oscillator as in claim 4, wherein the logic circuit includes a NOR gate having two inputs.

9. A voltage controlled ring oscillator as in claim 4, wherein the first delay circuit has a first delay $d_1$, the second delay circuit has a second delay $d_2$, the third delay circuit has a third delay $d_3$, the delay/inverter circuit has a fourth delay $d_4$, and the output of the logic circuit produces a waveform having a period equal to $d_1+d_4+(Cd_3)+\{(1-C)d_2\}$, where C is a variable dependent on the control voltage input of the mixer/inverter circuit.

10. A voltage controlled ring oscillator as in claim 4, wherein the first input of the mixer/inverter circuit has a first time t dependent voltage Vy(t), the second input of the mixer/inverter circuit has a second time t dependent voltage Vx(t), the mixer/inverter circuit has a delay D, and the output of the mixer/inverter circuit produces a voltage Vz equal to $1-\{(1-C)Vy(t-D)+CVx(t-D)\}$, where C is a variable dependent on the control voltage input of the mixer/inverter circuit.

11. A method for controlling a logic output voltage of a voltage controlled ring oscillator comprising the steps of:
   mixing a first mixer/inverter input voltage and a second mixer/inverter input voltage according to a control input voltage to produce a mixer/inverter output voltage;
   combining logically a first logic input voltage and the mixer/inverter output voltage to produce the logic output voltage;
   delaying the logic output voltage to produce the first logic input voltage;
   delaying and inverting the logic output voltage to produce a delay/inverter output voltage;
   delaying the delay/inverter output voltage to produce the first mixer/inverter input voltage; and
   delaying the delay/inverter output voltage to produce the second mixer/inverter input voltage.

12. A method for controlling a logic output voltage of a voltage controlled ring oscillator as in claim 11, wherein the logic output voltage has a Low (High) level transition after either the first logic input voltage or the mixer/inverter output voltage has a High (Low) level transition firstly, and wherein the logic output voltage has a High (Low) level transition after either the first logic input voltage or the mixer/inverter output voltage has a Low (High) level transition secondly.

13. A method for controlling a logic output voltage of a voltage controlled ring oscillator as in claim 11, wherein the delay/inverter output voltage is a delayed and inverted version of the logic output voltage.

14. A method for controlling a logic output voltage of a voltage controlled ring oscillator as in claim 11, wherein the delay/inverter output voltage is either delayed or not delayed in producing the first mixer/inverter input voltage.

15. A method for controlling a logic output voltage of a voltage controlled ring oscillator as in claim 11, wherein the step of combining includes a NOR logic function.

16. A method for controlling a logic output voltage of a voltage controlled ring oscillator as in claim 11, wherein:

delaying the logic output voltage to produce the first logic input voltage has a first delay $d_1$;

delaying the delay/inverter output voltage to produce the first mixer/inverter input voltage has a second delay $d_2$;

delaying the delay/inverter output voltage to produce the second mixer/inverter input voltage has a third delay $d_3$;

delaying and inverting the logic output voltage to produce the delay/inverter output voltage has a fourth delay $d_4$; and the logic output voltage has a period equal to $d_1+d_4+(Cd_3)+\{(1-C)d_2\}$, where C is a variable dependent on the control input voltage.

17. A method for controlling a logic output voltage of a voltage controlled ring oscillator as in claim 11, wherein the first mixer/inverter input voltage has a first time t dependent voltage Vy(t), the second mixer/inverter input voltage has a second time t dependent voltage Vx(t), the step of mixing has a delay D, and the mixer/inverter output voltage has a voltage Vz equal to $1-\{(1-C)Vy(t-D)+CVx(t-D)\}$, where C is a variable dependent on the control input voltage.

* * * * *